United States Patent
Niset et al.

(10) Patent No.: US 7,397,703 B2
(45) Date of Patent: Jul. 8, 2008

(54) NON-VOLATILE MEMORY WITH CONTROLLED PROGRAM/ERASE

(75) Inventors: Martin L. Niset, Austin, TX (US);
Derek J. Beattie, Glasgow (GB);
Andrew E. Birnie, Glasgow (GB);
Alistair J. Gorman, Dundee (GB);
Stephen McGinty, Paisley (GB)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 11/385,108

(22) Filed: Mar. 21, 2006

(65) Prior Publication Data

US 2007/0223276 A1 Sep. 27, 2007

(51) Int. Cl.
*G11C 16/06* (2006.01)
(52) U.S. Cl. .............. 365/185.22; 365/185.09; 365/185.24; 365/185.28; 365/185.29
(58) Field of Classification Search ............ 365/185.09, 365/185.22, 185.24, 185.29, 185.28
See application file for complete search history.

(56) References Cited

U.S. PATENT DOCUMENTS

| 5,835,415 | A | 11/1998 | Harari |
| 5,963,480 | A | 10/1999 | Harari |
| 5,991,201 | A | 11/1999 | Kuo et al. |
| 6,462,988 | B1 | 10/2002 | Harari |
| 6,504,762 | B1 | 1/2003 | Harari |
| 6,570,790 | B1 | 5/2003 | Harari |
| 6,643,181 | B2 * | 11/2003 | Sofer et al. ............ 365/185.22 |
| 7,236,402 | B2 * | 6/2007 | Suhail .................... 365/185.22 |
| 2003/0218920 | A1 | 11/2003 | Harari |

* cited by examiner

*Primary Examiner*—Hoai V Ho
(74) *Attorney, Agent, or Firm*—James L. Clingan, Jr.; Ranjeev K. Singh

(57) ABSTRACT

A method for programming/erasing a non-volatile memory (NVM) includes performing a program/erase operation on a portion of the NVM using a first set of parameters. The method further includes determining whether each cell in the portion of the NVM passes a first margin level, if not determining which one of a set of lower margin levels than the first margin level each cell in the portion of the NVM passes. The method further includes modifying at least one of the set of parameters associated with a subsequent program/erase operation for the portion of the NVM based on the determined one of the set of lower margin levels.

15 Claims, 4 Drawing Sheets

NON-VOLATILE MEMORY WITH CONTROLLED PROGRAM/ERASE

RELATED APPLICATIONS

This invention is related to U.S. application Ser. No. 11/220,733, filed Sep. 7, 2005, by Niset and Hardell, titled "Method and Apparatus for Programming/Erasing a Non-Volatile Memory," and assigned to the assignee hereof.

FIELD OF THE INVENTION

The present invention relates to non-volatile memory, and more particularly, to a method and apparatus for controllably programming/erasing a nonvolatile memory.

RELATED ART

Non-volatile memory (NVM) which is capable of being programmed and erased multiple times is commonly used in a wide variety of applications. Generally, as the NVM is programmed and erased, the condition of the memory cells that make up the NVM are effected. For example, the amount of programming and erasing time that is required may increase, but that amount of increase may be limited by specification requirements. The user may need to know what the maximum program or erase time is. This is compounded by the desire to have high endurance or high data retention. In the case of high endurance, higher erase voltages may be tolerated but may cause reduced data retention.

Accordingly, there is a need for improvement in the ability to address these concerns.

BRIEF DESCRIPTION OF THE DRAWINGS

The present invention is illustrated by way of example and not limited by the accompanying figures, in which like references indicate similar elements, and in which.

Figure 1:
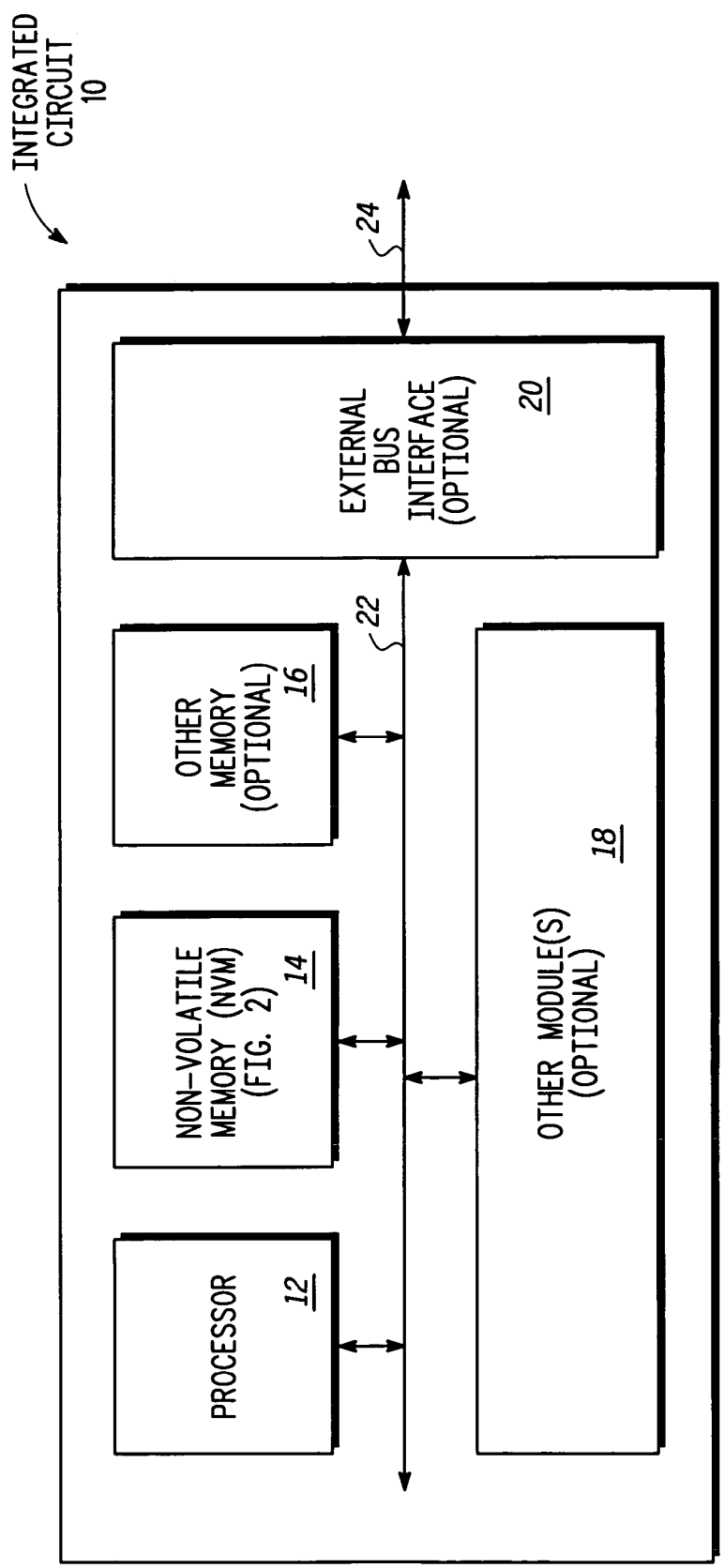
FIG. 1 illustrates, in block diagram form, an integrated circuit in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The data retention of an NVM cell is the amount of time that a predetermined data value will remain properly stored so that it is retrievable from the NVM cell. The endurance of the NVM cell is the maximum number of program/erase cycles that can be performed before the state of the NVM cell can no longer be reliably changed. Note that there are a variety of techniques that may be used to extend the viability of an NVM array when one or more NVM cells have failed either during testing or during usage (e.g. redundancy, error correction code, etc.).

NVMs may be programmed with any desired granularity. Although many NVMs are programmed on a per byte basis, alternate embodiments may be programmed on a bit, word, long word, sector, block, or any other desired basis. NVMs may be erased with any desired granularity. Although many NVMs are erased on a per sector basis, alternate embodiments may be erased on a bit, byte, word, long word, block, or any other desired basis.

A problem arises when a single NVM array 30 (see FIG. 2) must meet a maximum specification for data retention that is required by a first group of customers, while also meeting a maximum specification for endurance that is required by a second group of customers.

As one example, the first group of customers may be storing software code, e.g. instruction for processor 12 (see FIG. 1), which must remain stored for the lifetime of the product (e.g. twenty years). One example of such a product is an automobile which uses the NVM to store software code to perform engine control. This first group of customers may not require that the NVM perform many program/erase cycles. In this example, if the NVM stores software code, it is likely that the software code may never need to be erased and rewritten once it is initially stored in the NVM. Self-modifying software code is generally not used in most applications.

As a second example, the second group of customers may be storing data values, e.g. non-volatile but variable data, which needs to remain stored for a relatively shorter period of time (e.g. one month to five year). One example of such a product is an automobile which uses the NVM to store data values to represent engine tuning information. This second group of customers will require that the NVM perform many program/erase cycles (e.g. one program/erase cycle every time the automobile ignition is turned off and on). In this example, if the NVM stores data values, it is likely that the data values will be refreshed by a new program/erase cycle and thus do not need to have a long data retention time.

In addition, some customers will require both types of NVM in the same application. For example, the automotive customers described above will need some NVM having long data retention for software code, and will also need some NVM having high endurance for data values that are rewritten frequently. Also, customer requirements will vary as to how many portions and what size portions of the NVM will need to have long data retention. Similarly, customer requirements will vary as to how many portions and what size portions of the NVM will need to have high endurance.

FIG. 1 illustrates, in block diagram form, an integrated circuit (IC) 10 in accordance with one embodiment of the present invention. In the illustrated embodiment, IC 10 has a processor 12, an NVM 14, optional other memory 16, one or more optional other module(s) 18, and an optional external bus interface 20, each of which is bi-directionally coupled to bus 22. As used herein, the term bus is used to refer to a plurality of signals or conductors which may be used to transfer one or more various types of information, such as data, addresses, control, or status. Although only one bus is shown, more than one bus may be used.

In some embodiments, IC 10 is a stand alone NVM and circuits 12, 16, and 18 are not implemented. In this case, the external bus interface 20 includes the address and data bus drivers for the NVM 14. In other embodiments, IC 10 is a microcontroller which has an NVM 14 as just one circuit available on the microcontroller. Any one or more of circuits 12, 14, 16, 18, and 20 may be coupled to one or more integrated circuit terminals (not shown) which may be used to communicate external to IC 10. Other memory 16 may be any type of memory. Other modules 18 may include circuitry that is used for any desired purpose. Some examples of circuitry in other modules 18 includes timer circuitry, communication interface circuitry, display driver circuitry, analog to digital converters, digital to analog converters, power management circuitry, etc.

Figure 2:
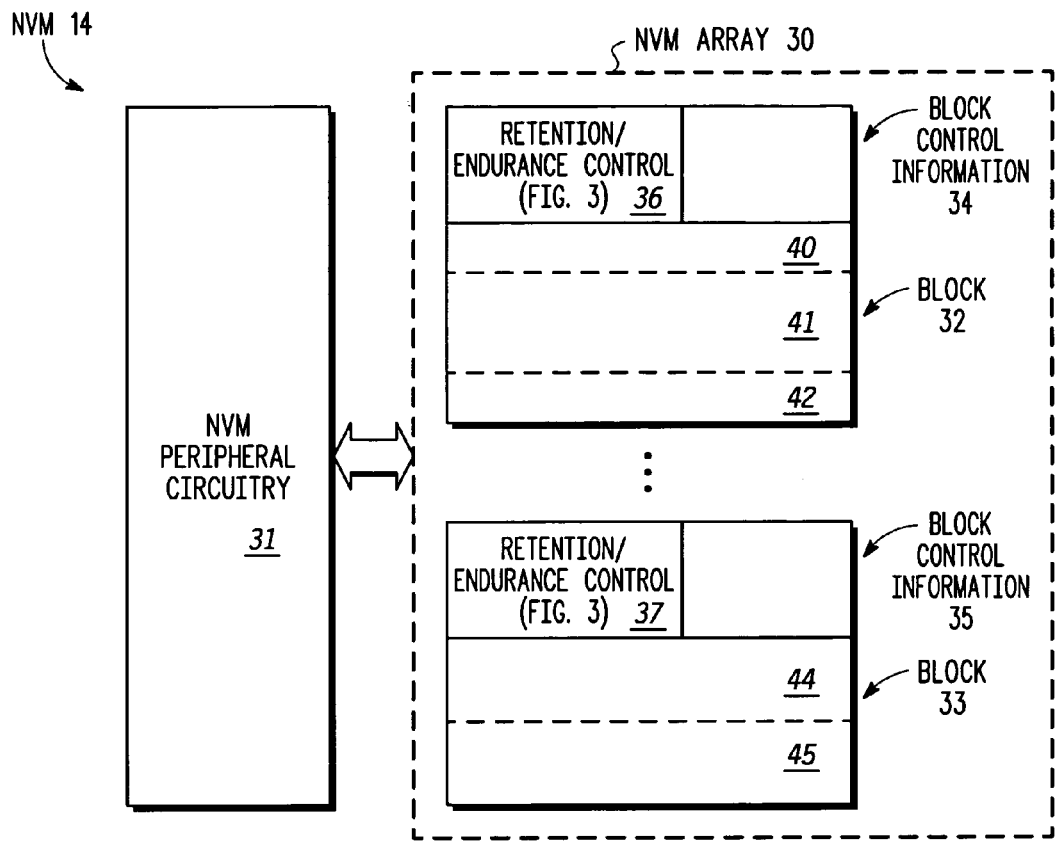
FIG. 2 illustrates, in block diagram form, an NVM 14 of FIG. 1 in accordance with one embodiment of the present invention.

FIG. 2 illustrates, in block diagram form, an NVM 14 of FIG. 1 in accordance with one embodiment of the present invention. In one embodiment, NVM 14 has an NVM array 30 bi-directionally coupled to NVM peripheral circuitry 31. NVM array 30 has a plurality of blocks, including block 32 and block 33. Block 32 has block control information 34 which stores information that is pertinent to block 32. Block 33 has block control information 35 which stores information that is pertinent to block 33. As one example, block control information 34 may include information which is used to control various characteristics of that particular NVM block 32 (e.g. duration and voltage of erase pulse, maximum erase time, duration and voltage of program pulse, maximum program time, margin levels, etc.). Some embodiments may also store other additional information (e.g. the NVM manufacturing and/or testing history) in the block control information 34. These examples also apply to block 33 and block control information 35. Although FIG. 2 illustrates two blocks 32, 33 in detail, alternate embodiments may use any number of blocks, including just one block.

In the illustrated embodiment, block control information 34 includes retention/endurance control circuitry 36, and block control information 35 includes retention/endurance control circuitry 37. Alternate embodiments may locate retention/endurance control circuitry 36 and 37 anywhere within integrated circuit 10. There may be any number of retention/endurance control circuits (e.g. 36) for NVM array 30. The illustrated embodiment uses one retention/endurance control circuit (e.g. 36, 37) for each NVM block. However, alternate embodiments may use one retention/endurance control circuit for a different granularity (larger or smaller than a block) within the NVM array 30. For example, the entire NVM array 30 may have one retention/endurance control circuit used to select the storage characteristic.

Dashed lines are used to represent portions 40-42 of block 32. Similarly, dashed lines are used to represent portions 44-45 of block 33. Each portion 40, 41, 42, 44, 45 has a plurality of NVM cells. Retention/endurance control circuit 36 may be used to determine how many portions block 32 is partitioned into, and the size of each of the portions. Retention/endurance control circuit 37 may be used to determine how many portions block 33 is partitioned into, and the size of each of the portions. In one embodiment, retention/endurance control circuit 36 may also be used to determine or select a storage characteristic for each of the portions 40-42. Similarly, retention/endurance control circuit 37 may also be used to determine or select a storage characteristic for each of the portions 44-45.

As an example, retention/endurance control circuit 37 may select portion 44 to have the storage characteristic of high endurance, while selecting portion 45 to have the storage characteristic of long data retention. Alternately, retention/endurance control circuit 37 may select portion 45 to have the storage characteristic of high endurance, while selecting portion 44 to have the storage characteristic of long data retention. In a similar manner, as one example, retention/endurance control circuit 36 may select portions 40 and 42 to have the storage characteristic of high endurance, while selecting portion 41 to have the storage characteristic of long data retention. Retention/endurance control circuit 36 may alternately select any combination of storage characteristics for portions 40-42. Retention and endurance are two possible examples of storage characteristics. Alternate embodiments may use different or more storage characteristics (e.g. degree of hardness against radiation, data integrity for selected temperature range, etc.).

In the illustrated embodiment, NVM peripheral circuitry 31 includes all other circuitry necessary for the operation of NVM 14. In one embodiment, NVM peripheral circuitry 14 has a charge pump, high voltage regulator, high voltage switches, word line drivers, source line drivers, sense amplifiers, row decoders, column decoders, an interface to bus 22, registers, a read reference circuit, a controller, test logic, and any other circuitry that is desired for the functionality of NVM 14 (not shown). Note that for one embodiment, NVM peripheral circuitry 31 may operate in a conventional manner.

Figure 3:
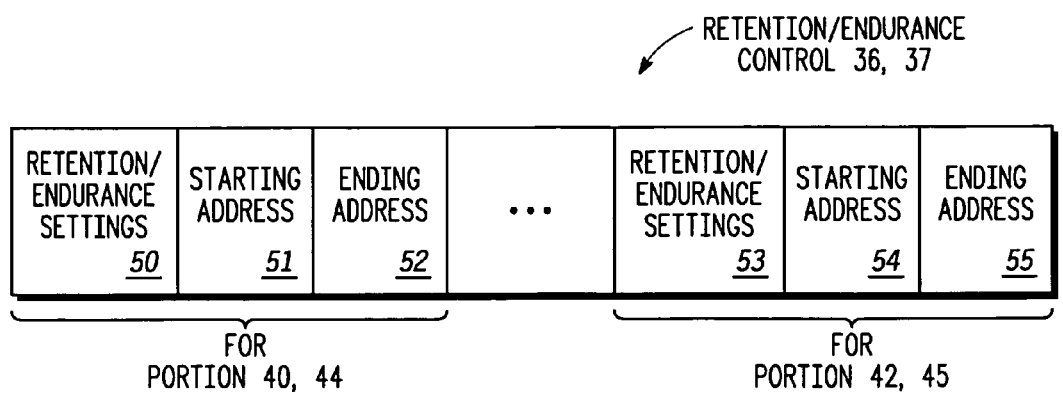
FIG. 3 illustrates, in block diagram form, a retention/endurance control circuit 36, 37 of FIG. 2 in accordance with one embodiment of the present invention.

FIG. 3 illustrates, in block diagram form, a retention/endurance control circuit 36, 37 of FIG. 2 in accordance with one embodiment of the present invention. In one embodiment, the retention/endurance settings 50 may be used to select the storage characteristic of the corresponding portion (portion 40 for retention/endurance control circuit 36, and portion 44 for retention/endurance control circuit 37). Similarly, the retention/endurance settings 53 may be used to select the storage characteristic of the corresponding portion (portion 42 for retention/endurance control circuit 36, and portion 45 for retention/endurance control circuit 37). In the embodiment illustrated in FIG. 3, there are two possible storage characteristics, namely long data retention and high endurance. Alternate embodiments may have three or more possible storage characteristics (e.g. long data retention, high endurance, and a combination which compromises between data retention and endurance). Alternate embodiments may use storage characteristic control circuit 50 to select between other storage characteristics. Endurance and data retention are just two possible examples of storage characteristics.

The starting address storage circuit 51 and the ending address storage circuit 52 are used to define the location and size of the corresponding NVM portion (portion 40 for control circuit 36, and portion 44 for control circuit 37). The starting address storage circuit 54 and the ending address storage circuit 55 are used to define the location and size of the corresponding NVM portion (portion 42 for control circuit 36, and portion 45 for control circuit 37). Alternate embodiments may define the location and size of the corresponding NVM portion in any desired manner. For example, a size storage circuit (not shown) may be used instead of an ending address storage circuit 52, 55. Alternately, the locations and sizes of the portion may be predetermined and the control storage circuits 51, 52, 54, 55 may not be needed. Alternately, other circuitry (e.g. protection circuitry in NVM peripheral circuitry 31) may be used to determine or partially affect the location and sizes of the portions 40, 41, 42, 44, 45.

Figure 4:
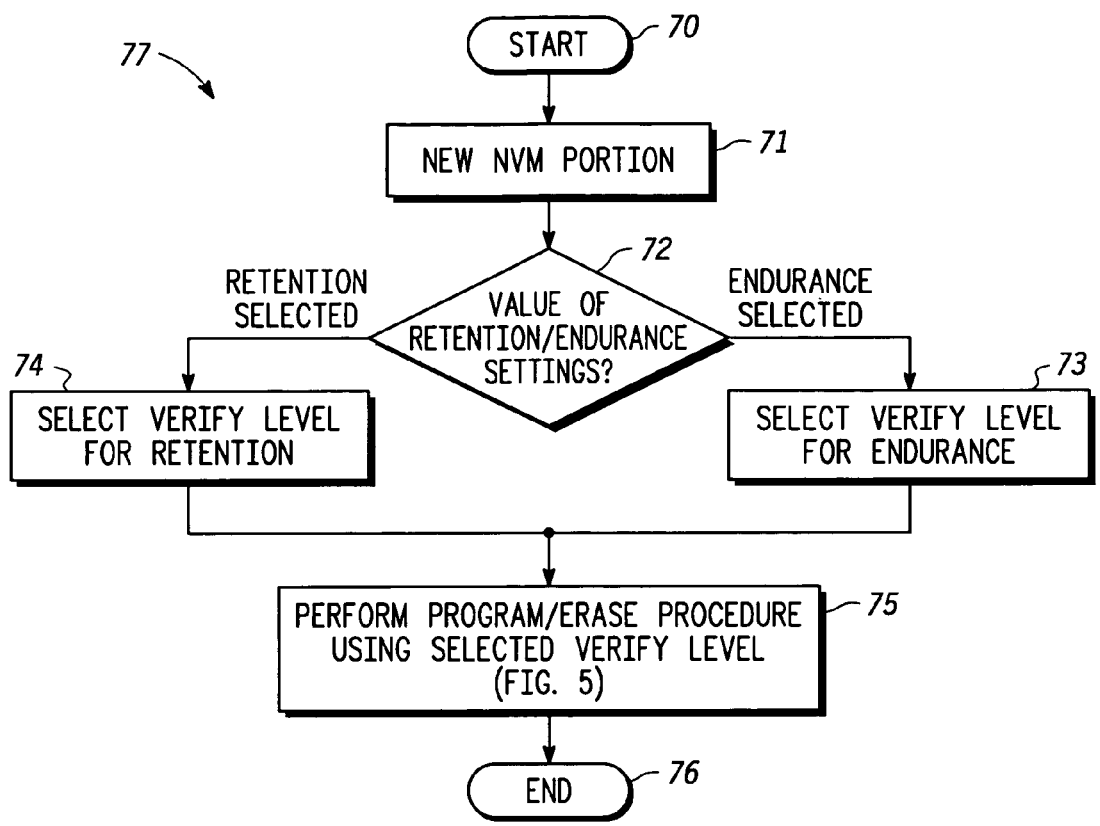
FIG. 4 illustrates, in flow diagram form, a method for programming/erasing an NVM.

FIG. 4 illustrates, in flow diagram form, a method for programming/erasing an NVM. The flow 77 starts at start oval 70 and proceeds to step 71 where a new NVM portion is selected or chosen. From step 71, the flow 77 continues to decision diamond 72 where the question is asked "what is the value of the retention/endurance setting 50, 53 for this portion?". If the value of the retention/endurance setting 50, 53 indicates that endurance is selected, the flow continues to step 73 where the verify level for endurance is selected. If the value of the retention/endurance settings 50, 53 indicates that long data retention is selected, the flow 77 continues to step 74 where the verify levels for long data retention is selected. From both steps 73 and 74, the flow 77 continues to step 75 where the program/erase procedure is performed using the verify levels selected in either step 73 or 74. From step 75, the flow 77 continues to oval 76 where the flow 77 ends.

Stimulus external to NVM array 30 may be used to initiate flow 77. One example of such an external stimulus may be processor 12 (see FIG. 1) initiating an erase or program within NVM 14. Note that the term program/erase has been used to indicate that the flow 77 may be used for both programming and erasing of NVM 14. Thus, the retention/endurance settings 50, 53 may be used in decision diamond 72 during either programming or erasing to determine whether high endurance or long data retention is selected.

Figure 5:
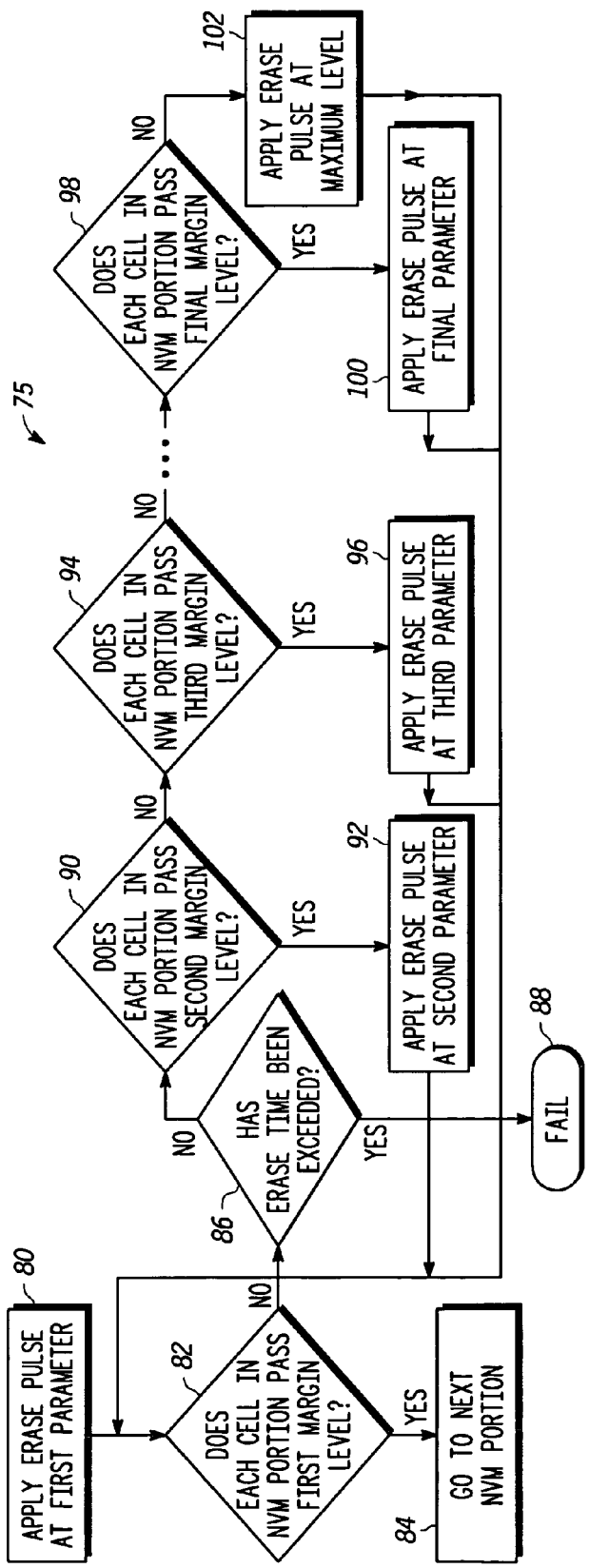
FIG. 5 illustrates, in flow diagram form, a method for performing an erase procedure 75 in an NVM in accordance with one embodiment of the present invention.

FIG. 5 illustrates, in flow diagram form, method step 75 of FIG. 4 for an erase. In FIG. 5, the flow starts at step 80 where the relevant NVM portion is attempted to be erased using a pulse which has first parameters. In this example, the parameters for the erase pulse are a particular duration and voltage for a trapezoidal pulse. The parameters could also be for other things such as for the shape of the pulse. For portion 40 and 44 in this example, these parameters are stored in retention/endurance settings 50 as shown in FIG. 3. From step 80, the flow continues to step 82 where each cell in the relevant NVM portion is read to compare the actual read current to the selected verify level which is shown as the first margin level. The reason it can be called a "margin level" is that it exceeds the minimum amount, by some selected margin, required to determine between the programmed and erase state. The first margin level was selected in flow 77 (see FIG. 4) in either step 73 or step 74.

After application of the erase pulse at the first parameters, the NVM portion is read to determine if all of the memory cells in the NVM portion to be erased are erased to at least the first margin. If each memory cell of the NVM portion passes the first margin, the NVM portion is considered erased and the erasing of another NVM portion can commence. In all the tests of the NVM portion in this described example of method 75, passing is achieved only by all of memory cells of the NVM portion under test passing the particular margin level. Early in the life of the NVM, it is common for an NVM portion to pass after just one application of the erase pulse.

If the NVM portion being erased does not pass using the first margin level, a determination in step 86 is made as to the relationship between the time that has been expended on erasing the NVM portion as compared to the maximum erase time allowed. Step 86 is always performed after an NVM portion has failed to pass the first margin level. Once the erase time has been exceeded for a particular NVM portion, the NVM portion is considered defective and the erasing can continue on other NVM portions or the entire device can be considered to have failed. If the erase time has not been exceeded for a particular NVM portion, then the NVM portion is tested, step 90, to see if it passes a second margin level. This would be a lower margin than the margin at the first margin level. If the NVM portion passes, then another erase pulse, step 92, is applied but this time at second parameters which preferably increase the duration of the pulse but could increase the voltage or both the voltage and the duration compared to erase pulse of the first parameters. Of course, after just the application of the erase pulse using the first parameters, the maximum erase time would not have elapsed.

After the new erase pulse is applied at the second parameters, the NVM portion is again tested to see if it passes the first margin level. If so, erasing of the next NVM portion can commence. If not, the NVM portion is tested to see if it passes the second margin level. Presumably it would pass that level because it already had passed it. The NVM portion will then again receive the erase pulse at the second parameters and be tested for the first margin level. If it passes, then erasing of other NVM portions can proceed. If it fails, then the process continues of applying the erase pulse at the second parameters and testing for passing under the first margin levels until either the NVM portion passes the margin first level or the erase time has been exceeded.

If the NVM portion does not pass the second margin level, a test of the NVM portion with respect to third parameters is performed. If the NVM portion passes at step 94, then the erase pulse is applied at third parameters, step 96, which are preferably greater in either duration or voltage or both than the erase pulse at the second parameters. After application of the erase pulse with the third parameters, the process begins again with testing for the first margin level, step 82, and continues as described previously for either step 84 or 86 to follow. If it does not pass, then testing continues at other lower margin levels with subsequent increased-strength erase pulses. In this example, the final level having a corresponding pulse when the level has been met is shown as step 98. Thus, when the NVM portion passes a final margin level at step 98, the erase pulse is applied at the final parameters, which are the parameters that are used when the NVM portion has passed the final margin level. After application of the erase pulse with the final parameters, the process begins again with testing for the first margin level, step 82, and continues as described previously for either step 84 or 86 to follow. If the NVM portion cannot even pass the final margin level, the erase pulse is applied at a maximum level. The erase pulse at the maximum level is the erase pulse that has greatest strength of any of the erase pulses that are available to be selected under method 75. This is preferable to considering the NVM portion as having failed because, especially in high endurance applications, bringing the NVM portion to the erased state under the first margin level, even with a very strong erase pulse, would provide some utility.

Figure 6:
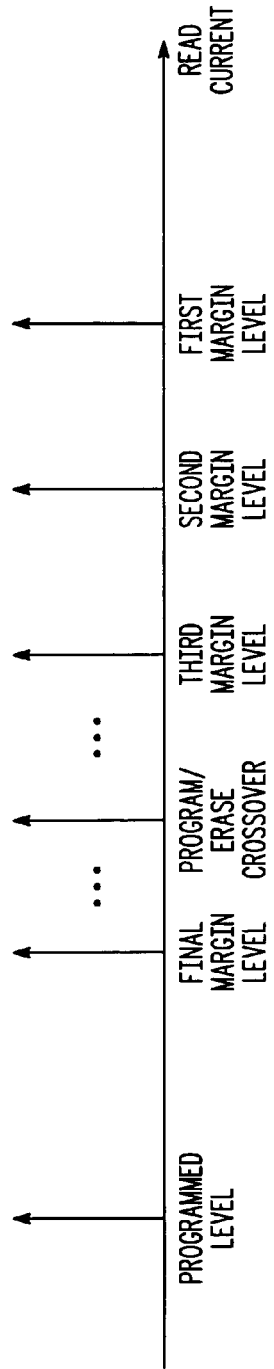
FIG. 6 illustrates, in graphic form, differing states resulting from an erase step, the deciding line between program and erase, and a typical program state.

Shown in FIG. 6 is a diagram of the margin levels, the program/erase crossover, and the programmed level. The program/erase crossover is the read current which divides between indicating the erased condition or the programmed condition. This is set by the sense amplifier that is used. The first margin level is the level at which a cell is considered to have the desired margin. Of the various margin levels, the first margin level is the one that indicates the desired state, which is the erased state in this example, has the greatest difference between it and the program/erase crossover. The difference is the margin. The second margin level has the second biggest difference, and the third has the third biggest difference. In each of the cases of the first, second and third margin levels, the cell is erased but with different amounts of margin. In effect they have positive margin. An erase pulse may result in a cell not even becoming erased so the difference between its read current and the program/erase crossover is negative. So because it is intended to be erased but is still on the programmed side, it can be considered to have negative margin. In this example the last state tested for is the final margin level, which is shown as having a negative margin.

Another way to view FIG. 6 is that the first margin level is the targeted value and the other margin levels are departures from the targeted value. Thus, the second margin level is less departure from the targeted margin value than is the third margin level. Thus, also, the final margin level is the greatest departure from the targeted level of the margin values that are used for testing the NVM portion. Thus, the subsequent erase pulse has a greater modification, increase in strength in this example, for a greater departure from the targeted value.

The number of different levels tested for is shown to be four; the first, second, third, and final levels, but there can be more as indicated with the regions between the final margin level and the program/erase level and between the third margin level and the program/erase level. These tests are a good way to determine the margin of the cell having the worst (least) margin. After making that determination, an erase pulse is applied which is tailored for the margin that was found to be the worst. This is a way to reduce the time required to achieve erase while not applying an erase signal that is unnecessarily strong. The deterioration in the performance of NVM cells is related to the strength of the erase pulses. This method provides for a way to obtain worst case margin information whose accuracy is based on how many margins are tested for. In this example, four is believed to be a good number that provides for beneficially tailoring the erase pulse without requiring too much time to make the determination. Other similar techniques may also be found to be useful, especially if a higher degree of resolution is required. Successive approximation may be found to be useful, for example.

In the described example, the margin levels are reference currents which are compared to the read current from an NVM cell. The margin levels for high endurance are lower reference currents, whereas for long data retention the margin levels are a higher reference current. The absolute levels of reference currents for both high endurance and long data retention will depend upon the specific circuits used to implement the NVM 14.

Alternate embodiments may use something other than a reference current to represent the margin levels. For example, the margin levels may be reference voltages in which a margin level may be a reference voltage that is compared to an NVM cell voltage (e.g. transistor threshold voltage). Alternate embodiments may use any desired circuit characteristic to represent the margin levels.

In the foregoing specification, the invention has been described with reference to specific embodiments. However, one of ordinary skill in the art appreciates that various modifications and changes can be made without departing from the scope of the present invention as set forth in the claims below. For example, the erase are described as being in ascending strength, however, there may be situations in which an increase in strength may not be required. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for programming/erasing a non-volatile memory (NVM), comprising:
   performing a program/erase operation on a portion of the NVM using a first set of parameters;
   determining whether each cell in the portion of the NVM passes a first margin level;
   if the each cell in the portion of the NVM does not pass the first margin level,
      determining an amount of departure in an actual value of at least one parameter associated with the program/erase operation from a target value of the at least one parameter;
      modifying a subsequent program/erase operation for the portion of the NVM based on the amount of departure in the actual value of the at least one parameter;
      performing the subsequent program/erase operation on the portion of the NVM and
      determining whether each cell in the portion of the NVM passes the first margin level after performing the subsequent program/erase operation; and
   performing the program/erase operation on a next portion of the NVM, if each cell in the portion of the NVM passes the first margin level.

2. The method of claim 1, wherein the at least one parameter associated with the program/erase operation comprises at least one of a read voltage and a read current.

3. The method of claim 1, wherein the step of determining the amount of departure comprises:
   defining a plurality of additional margin levels and a plurality of additional program/erase operations, wherein the additional margin levels each have a different standard and each have a lower standard than the first margin level;
   defining a correspondence between the additional erase/program operations and the additional margin levels; and
   determining which additional margin level of the additional margin levels has the highest standard that each cell can pass as a selected margin level; wherein
   the additional program/erase operation that corresponds to the selected margin level is the subsequent program/erase operation.

4. The method of claim 1 further comprising performing the subsequent program/erase operation using a second set of parameters, if at least one cell in the portion of the NVM fails to pass a first margin level and if each cell in the portion of the NVM passes a second margin level.

5. The method of claim 1 further comprising performing the program/erase operation at a maximum level, if at least one cell in the portion of the NVM fails to pass a final margin level.

6. The method of claim 1 further comprising determining whether a maximum time value associated with the program/erase operation has been exceeded and if so then indicating a failure of the program/erase operation for the portion of the NVM.

7. The method of claim 1, wherein modifying the subsequent program/erase operation comprises modifying at least one of time, voltage, current, and shape of at least one pulse associated with the subsequent program/erase operation.

8. A method for programming/erasing a non-volatile memory (NVM), comprising:
   performing a program/erase operation on a portion of the NVM using a first set of parameters;
   determining whether each cell in the portion of the NVM passes a first margin level:
      if each cell in the portion of the NVM does not pass the first margin level, determining which one of a set of lower margin levels having a lower standard than the first margin level has the highest standard that each cell in the portion of the NVM can pass; and modifying at least one of the set of parameters associated with a subsequent program/erase operation for the portion of the NVM based on the determined one of the set of lower margin levels; and performing the subsequent program/erase operation on the portion of the NVM; and after performing the subsequent program/erase operation, determining whether each cell in the portion of the NVM passes the first margin level.

9. The method of claim 8 further comprising performing the program/erase operation on a next portion of the NVM, if each cell in the portion of the NVM passes the first margin level.

10. The method of claim 8 further comprising subsequent to the modifying step performing the program/erase operation at a maximum level, if at least one cell in the portion of the NVM fails to pass a lowest margin level of the set of lower margin levels.

11. The method of claim 10 further comprising determining whether each cell in the portion of the NVM cell passes the first margin level in response to the program/erase operation at the maximum level.

12. The method of claim 8 further comprising determining whether a maximum time value associated with the program/erase operation has been exceeded and if so then indicating a failure of the program/erase operation for the portion of the NVM.

13. The method of claim 8, wherein the set of parameters associated with the subsequent program/erase operation includes at least one of a time, voltage, current, and shape.

14. A non-volatile memory (NVM) system comprising:

an NVM array;

an NVM peripheral circuitry for performing a program/erase operation on a portion of the NVM array using a first set of parameters to cause a condition in each memory cell of the portion of the NVM array; and a controller for determining whether the condition of each cell in the portion of the NVM array passes a first margin level; if the condition of each cell in the portion of NVM array does not pass the first margin level, for determining which one of a set of lower margin levels than the first margin level has the highest level that the condition of each cell in the portion of the NVM array can pass; for modifying at least one of the set of parameters associated with a subsequent program/erase operation for the portion of the NVM array based on the determined one of the set of lower margin levels; for performing the subsequent program/erase operation on the portion of the NVM array; and for determining if each cell, after the performing the subsequent program/erase operation, has a subsequent condition that passes the first margin level.

15. The NVM system of claim 14, wherein the first set of parameters associated with the subsequent program/erase operation includes at least one of a time, voltage, current, and shape.

* * * * *